United States Patent [19]

Cho et al.

[11] Patent Number: 5,414,214
[45] Date of Patent: May 9, 1995

[54] RESISTANCE HEATED, SEALED MICROFABRICATED DEVICE PACKAGE METHOD AND APPARATUS

[75] Inventors: Frederick Y.-T. Cho, Scottsdale; Michael J. Anderson, Phoenix; Howard D. Knuth, Tempe, all of Ariz.

[73] Assignee: Motorola, Inc., Schaumburg, Ill.

[21] Appl. No.: 265,985

[22] Filed: Jun. 27, 1994

Related U.S. Application Data

[63] Continuation of Ser. No. 961,990, Oct. 16, 1992, abandoned.

[51] Int. Cl.⁶ .................................................. H05K 5/06
[52] U.S. Cl. ...................................... 174/52.3; 53/478; 174/52.4
[58] Field of Search ................ 174/52.1, 52.2, 52.3, 174/52.4; 219/209, 85.21, 85.22; 53/478

[56] References Cited

U.S. PATENT DOCUMENTS

| | | | |
|---|---|---|---|
| 4,162,465 | 7/1979 | Hunsinger et al. | 333/194 |
| 4,507,907 | 4/1985 | Wolfson | 53/478 |
| 4,572,924 | 2/1986 | Wakely et al. | 174/52 FP |
| 4,582,975 | 4/1986 | Daughton | 219/209 |
| 4,592,794 | 6/1986 | Davis et al. | 156/89 |
| 4,633,285 | 12/1986 | Hunsinger et al. | 357/26 |
| 4,712,161 | 12/1987 | Pryor et al. | 361/411 |
| 4,746,583 | 5/1988 | Falanga | 428/632 |
| 4,750,800 | 6/1988 | Fournier et al. | 350/96.11 |
| 4,852,250 | 8/1989 | Andrews | 29/827 |
| 4,871,226 | 10/1989 | Courtney et al. | 350/96.17 |
| 4,893,161 | 1/1990 | Tanski et al. | 357/24 |
| 4,967,315 | 10/1990 | Schelhorn | 361/424 |
| 5,008,492 | 4/1991 | Brown et al. | 174/52.4 |

*Primary Examiner*—Leo P. Picard
*Assistant Examiner*—Christopher Horgan
*Attorney, Agent, or Firm*—Frederick M. Fliegel

[57] ABSTRACT

An apparatus (105, 301) for enclosing a microfabricated component (225) includes a package base (120, 405, 910), a package lid (110, 510, 950) and a seal (215) coupled to the package base (120, 405, 910) and to the package lid (110, 510, 950). The apparatus (105, 301) further includes a conductive loop (210, 610, 920) thermally coupled to the seal (215). Electrical energy is supplied to the conductive loop (210, 610, 920) to heat the conductive loop (210, 610, 920) and seal (215) to melt the seal (215) and thereby to seal the package base (120, 405, 910) to the package lid (110, 510, 950), providing a sealed environment for the microfabricated component (225).

18 Claims, 7 Drawing Sheets

205

RESISTANCE HEATED, SEALED MICROFABRICATED DEVICE PACKAGE METHOD AND APPARATUS

This application is a continuation of prior application Ser. No. 07/961,990, filed Oct. 16, 1992, now abandoned.

CROSS-REFERENCE TO RELATED APPLICATIONS

This application is related to co-pending U.S. patent application Ser. Nos. 918,771, filed on Jul. 27 of 1992; 802,929, filed on Dec. 6 of 1991; 897,123, filed on Jun. 11, 1992 and 767,338, filed on Sep. 30 of 1991, all of which are assigned to the same assignee as the present application.

FIELD OF THE INVENTION

This invention relates in general to the field of packages and packaging for microfabricated devices, in particular to sealed packages and packaging methods and more particularly to resistance heating to provide hermetically sealed packages for microfabricated devices.

BACKGROUND OF THE INVENTION

Hermetic sealing is important for many microfabricated devices and/or components requiring contamination-free surfaces in order to operate as intended. Examples of such devices include surface acoustic wave (SAW) filters and other types of acoustic devices as described, for example, in U.S. Pat. No. 4,162,465, entitled "Surface Acoustic Wave Device With Reflection Suppression", by B. J. Hunsinger and K. Hanma, acoustic charge transport (ACT) devices as described in U.S. Pat. No. 4,633,285, entitled "Acoustic Charge Transport Device and Method", by B. J. Hunsinger and M. J. Hoskins, heterostructure ACT devices as described, by way of example, in U.S. Pat. No. 4,893,161, entitled "Quantum-Well Acoustic Charge Transport Device" by W. J. Tanski et al., integrated optical components as described in U.S. Pat. No. 4,750,800, entitled "Low Stress Mounting of Integrated Optic Chips", by J. T. Fournier et al. and in U.S. Pat. No. 4,871,226, entitled "Mounting of Optical Fibers to Integrated Optical Chips", by D. P. Courtney et al. as well as other devices wherein the conditions of surfaces of the microfabricated device are crucial to device performance. The above-noted patents and patent applications are hereby incorporated herein by reference.

Such devices are manufactured by well-known photolithographic techniques and often have the property that they are no longer functional or operable if heated above a Curie temperature or a melting temperature of one or more constituent portions. As such, these devices often cannot be subjected to the temperature extremes required in order to provide a hermetic seal, for example by welding.

Conventional packaging techniques for such devices (e.g., seam welding of metallic lids to flat packages or flatpacks) often require labor-intensive manual procedures which do not lend themselves to automated production techniques. It has been especially uneconomical and impractical to provide automated mass production techniques for localized heating to the seal area itself without heating the package and the device contained therein.

What are needed are methods and apparatus for providing sealed packages for microfabricated components which packages can be sealed en masse and which do not require heating of the entire microfabricated device and package to the temperatures required in order to form a seal. A further need is for packages which can be repeatedly sealed and unsealed without exposing the components contained therein to temperature extremes.

SUMMARY OF THE INVENTION

Accordingly, there is provided a new and improved apparatus for enclosing a microfabricated component. The apparatus includes a package base for providing a plinth, a package lid and a seal coupled to the package base and to the package lid. The apparatus further includes a conductive loop thermally coupled to the seal. Electrical energy is supplied to the conductive loop to heat the conductive loop and seal, melting the seal and thereby sealing the package base to the package lid.

In one embodiment, the conductive loop is integrally attached to the package base. In another embodiment, the conductive loop is integrally attached to the package lid.

The present invention further provides a method for sealing a package for a microfabricated device. The method comprises a step of providing a package including a base and a lid, wherein the package includes a loop of conductive material having at least a pair of interconnections attached thereto and further includes a sealant material disposed over the loop of conductive material. The package also includes an attached microfabricated device.

The method further includes steps of applying electrical power to the at least a pair of interconnections to heat the loop of conductive material, melting the sealant material with heat from the loop of conductive material and then cooling the package, the loop of conductive material and the sealant material to provide a sealed package for the microfabricated device.

The method desirably but not essentially includes carrying out the steps of providing, applying, melting and cooling on groups of devices simultaneously and then separating the groups of packaged devices into individually packaged devices.

The method desirably but not essentially includes a step of electrically testing the sealed package and device prior to the separating step.

In another embodiment, the present invention comprises a communications apparatus including at least one microfabricated device in a package. The package comprises a package base for providing a plinth and a package lid coupled to the package base to provide a sealed enclosure.

The package further comprises seal material coupled to the package base and to the package lid, a conductive loop thermally coupled to the seal material and conductors for supplying electrical energy to the conductive loop to heat the conductive loop and seal material to melt the seal material and thereby to seal the package base to the package lid.

In another embodiment, the invention provides a resealable apparatus for enclosing a multichip module. The resealable apparatus includes a package base for providing a plinth including interconnections and a package lid. A resealable seal is coupled to the package base and to the package lid. A conductive loop is thermally coupled to the resealable seal and conductors for conducting electrical energy to the conductive loop allows electrical current to heat the conductive loop and the resealable seal to melt the resealable seal and thereby to seal or unseal the package base to the package lid.

BRIEF DESCRIPTION OF THE DRAWINGS

A more complete understanding of the present invention may be derived by referring to the detailed description and claims when considered in connection with the figures, wherein like reference numbers refer to similar items throughout the figures, and:

DETAILED DESCRIPTION OF THE DRAWINGS

Figure 1:
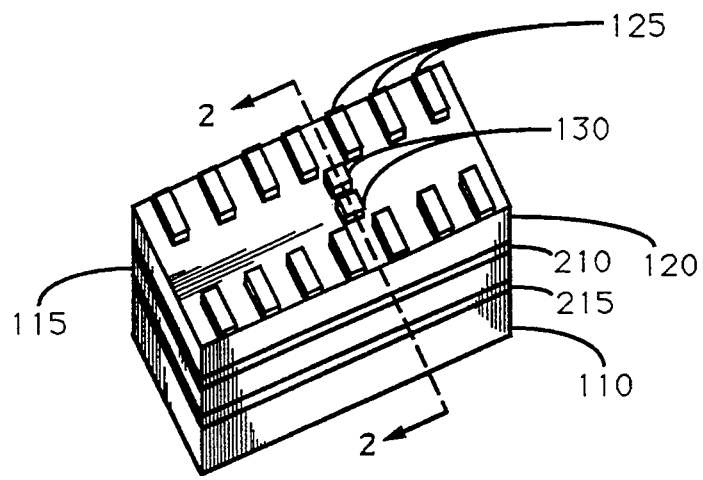
FIG. 1 is a simplified isometric bottom view of a package for a microfabricated device in accordance with a first embodiment of the present invention.

FIG. 1 is a simplified isometric bottom view of package 105 for a microfabricated device (not shown) in accordance with a first embodiment of the present invention. Package 105 comprises lid 110, insulating spacer 115, conductor 210 and plinth 120 sealed together by sealant 215 to provide a hermetically sealed environment housing a microfabricated component (not shown). Package 105 may comprise a package for a plurality of microfabricated components, also known as a multichip module.

Plinth 120 is shown as having a plurality of interconnections 125 arranged in a dual-in-line configuration and adapted for automated surface mounting of package 105 onto an electronic assembly (not shown), for example, however, many different arrangements of interconnections (e.g., interconnections 125) are possible, as is well known in the art.

While interconnections 125 comprising conductive regions fashioned by thick- or thin-film processes, such as screen printing and firing and/or electroplating are illustrated, other types of interconnections (e.g., fiber optic or other optical waveguides, etc.) are also applicable as is well known in-the art. Plinth 120 also includes electrical interconnections 130.

Resist pastes suitable for thick-film screening are available from a variety of vendors including Haraeus Cermalloy of West Conshohocken, Pa. and E. I DuPont Nemours of Wilmington, Del. Metal pastes and/or solder pastes may be used to provide low-resistivity conductors.

In one embodiment of the present invention, plinth 120 and insulating spacer 115 comprise ceramic materials such as any of AlN ceramics, 92% alumina, 99.6% alumina, 96% alumina, "green tape" low temperature co-fired ceramic materials such as are available from, for example, Coors Ceramics of Chattanooga, Tenn.; Kyocera America, Inc. of San Diego, Calif.; Narumi, Asahi Glass, Fujitsu, Hitachi, IBM, Matsushita, Murata, Toshiba and Sumitomo Metal of Japan; Microelectronic Packaging America of San Diego, Calif.; and E. I. DuPont Nemours of Wilmington, Del., those of skill in the art will recognize that a broad variety of suitable materials are readily available and fully suitable for the proposed package within the microelectronic package industry as is well known to those having skill in the relevant arts.

Lid 110 may comprise a metallic lid comprising bowl stamped nickel, Kovar or Alloy 42, available, for example, from Microelectronic Packaging America of San Diego, Calif. and/or from Sumitomo Metal, Japan, a ceramic lid comprising, for example, 91% pressed alumina and available, for example, from Kyocera of Japan and/or a glass lid. The above-noted vendors supply such lids having metallic and/or other materials deposited thereon to form seal rings, etc., as desired.

Solder materials are also available in a variety of forms from Semi Alloys, Mount Vernon, N.Y. and/or Indalloy of Utica, N.Y., having melting temperatures ranging from 70 to several thousand degrees Celsius, for example.

Figure 2:
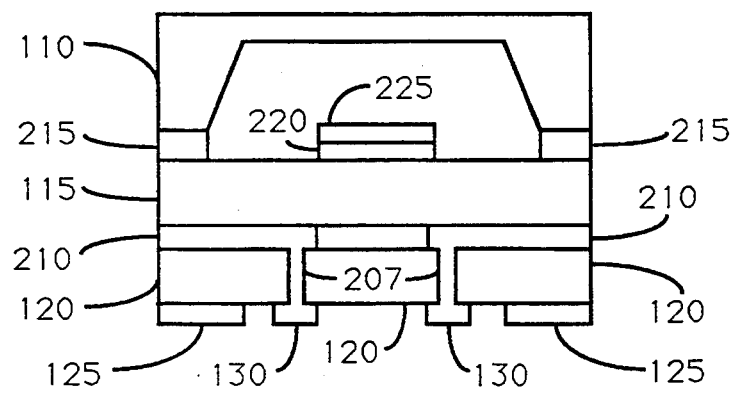
FIG. 2 is a simplified side view, in section, taken along section lines 2—2 of FIG. 1, of the package in accordance with the first embodiment of the present invention.

FIG. 2 is a simplified side view, in section, taken along section lines 2—2 of FIG. 1, of portion 205 of package 105 in accordance with the first embodiment of the present invention. Portion 205 comprises plinth 120 including interconnections 125 and electrical interconnections 130. Electrical interconnections 130 are coupled to conductor 210 by vias 207 filled with conductive material and extending through insulating plinth 120. Conductor 210 comprises conductive material deposited on plinth 120 by thin-film techniques (e.g., sputtering, vacuum evaporation, electro- or electroless-plating techniques, etc., as are well known in the art) or by thick-film methods such as screen printing and firing or the like. Conductor 210 is typically disposed peripherally around plinth 120 and on one side thereof.

Portion 205 further comprises insulating spacer 115 disposed atop conductor 210 and secured thereto by co-firing, for example. Insulating spacer 115 is depicted as having at least one microfabricated device 225 attached thereto by die attach material 220. Microfabricated device 225 may comprise an acoustic wave filter, by way of example, coupled to interconnections 125 by vias analogous to vias 207 but extending through plinth 120 and/or insulating spacer 115, for example, which vias are in turn coupled to microfabricated device 225 by wire bonds, conductive or solder bumps, etc., for example, as are well known in the art. Many other interconnection arrangements are possible in accordance with well established practices.

Insulating spacer 115 is coupled to lid 110 by seal material, or sealant, 215. Sealant 215 comprises solder, glass or glassy materials, plastic or thermoplastic materials or other suitable materials as is well known in the art. Solder, for example, is well suited to use with lids 110 comprising metal, ceramic and/or glass having a solder-wettable seal ring on that surface of lid 110 adjacent seal material 215.

Alternatively, sealing material 215 comprising glass or glassy materials is useful with lids such as 110 comprising glass, metal and/or ceramic materials. Sealant 215 secures lid 110 to insulating spacer 115, providing a hermetically sealed cavity enclosing microfabricated device 225.

Figure 3:
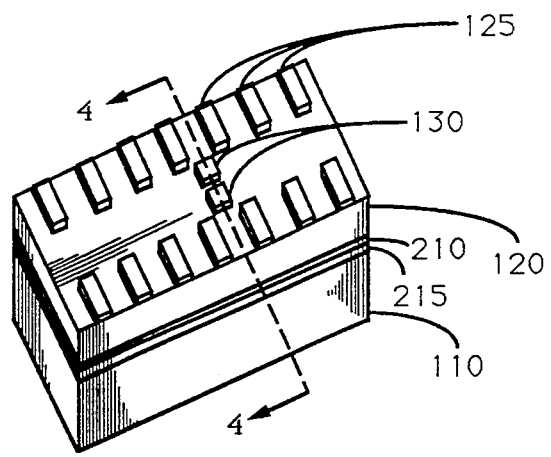
FIG. 3 is a simplified isometric bottom view of a package for a microfabricated device in accordance with a second embodiment of the present invention.

FIG. 3 is a simplified isometric bottom view of package 301 for a microfabricated device (not shown in FIG. 3) in accordance with a second embodiment of the present invention. Package 301 comprises lid 110, conductor 210 and plinth 120 sealed together by sealant 215, providing a hermetically sealed environment housing a microfabricated component (not shown in FIG. 3). Plinth 120 is shown as having a plurality of interconnections 125 arranged in a dual-in-line configuration and adapted for automated surface mounting of package 301 onto an electronic assembly (not shown), for example, however, many different arrangements of interconnections (e.g., interconnections 125) are possible, as is well known in the art. While interconnections 125 comprising conductive regions fashioned by thick- or thin-film processes, such as screen printing and firing and/or electroplating are illustrated, other types of interconnections (e.g., fiber optic or other optical waveguides, etc.) are also applicable as is well known in the art. Plinth 120 also includes electrical interconnections 130.

Figure 4:
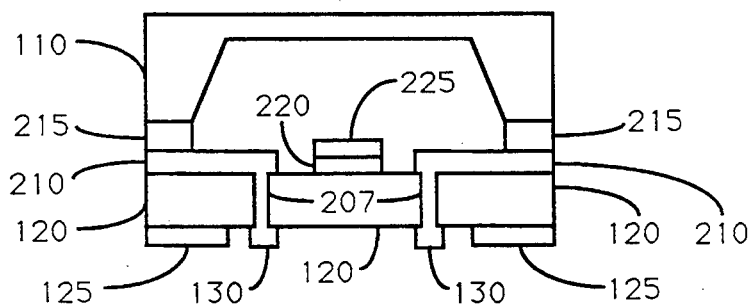
FIG. 4 is a simplified side view, in section, taken along section lines 4—4 of FIG. 3, of the package in accordance with the second embodiment of the present invention.

FIG. 4 is a simplified side view, in section, taken along section lines 4—4 of FIG. 3, of portion 305 of package 301 in accordance with the second embodiment of the present invention. Portion 305 comprises plinth 120 including interconnections 125 and electrical interconnections 130. Electrical interconnections 130 are coupled to conductor 210 by vias 207 filled with conductive material and extending through insulating plinth 120. Plinth 120 is coupled to lid 110 by seal material, or sealant, 215 disposed directly atop conductive material 210. In this embodiment, sealant 215 comprises an insulating material such as glass or glassy or plastic or thermoplastic materials, a "sandwich" of conductive and insulating materials such that conductive portions of sealant 215 are insulated from conductor 210 or such that sealant 215 comprises a portion of conductor 210 (e.g., sealant 215 and/or conductor 210 may comprise solder material). Sealant 215 secures lid 110 to plinth 120, providing a hermetically sealed cavity enclosing microfabricated device 225.

Figure 5:
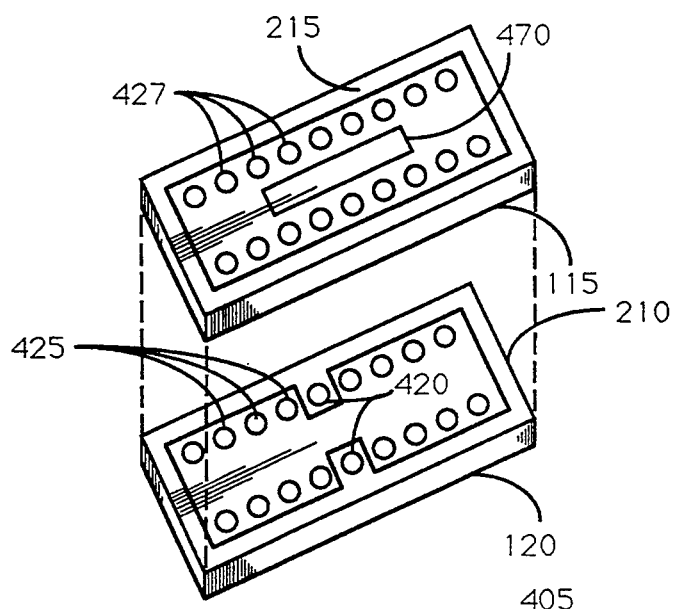
FIG. 5 is an exploded view of a package base in accordance with the first embodiment the present invention.

FIG. 5 is an exploded view of package base 405 in accordance with the first embodiment of the present invention. Package base 405 comprises plinth 120 coupled to insulating spacer 115 (FIGS. 1 and 2), for example, or comprises plinth 120 without insulating spacer 115 (FIGS. 3 and 4).

Plinth 120 includes vias (not shown) analogous to vias 207 (FIGS. 2 and 4) terminating in conductive pads 425 on a first side of plinth 120 and in interconnections (not shown in FIG. 5) such as interconnections 125 (FIGS. 1 and 3) on a side of plinth 120 opposed to the first side, for example. Plinth 120 also includes conductor 210 disposed peripherally about one surface and having electrical contacts 420 coupled to vias such as 207 (FIGS. 2 and 4) and thereby to externally accessible contacts such as electrical interconnections 130 (FIGS. 1 through 4) (not shown).

Insulating spacer 115 includes optional device mounting pad 470 and conductive pads 427. Conductive pads 427 are coupled to vias (not shown) analogous to vias 207 (FIGS. 2 and 4) extending through insulating spacer 115. Some of pads 427 are arranged above and electrically coupled to pads 425 of plinth 120 such that one each of pads 427 is coupled to at most one each of pads 425, allowing distinct electrical continuity to be established from each of pads 427 on a top surface of insulating spacer 115 to each of interconnections 125 (FIGS. 1 and 3) on a bottom surface of plinth 120, for example. Insulating spacer 115, pads 427, plinth 120 and pads 425, together with attendant vias, etc., are readily manufactured by screen printing and co-firing processes for ceramic materials, for example, as are well known in the art.

Figure 6:
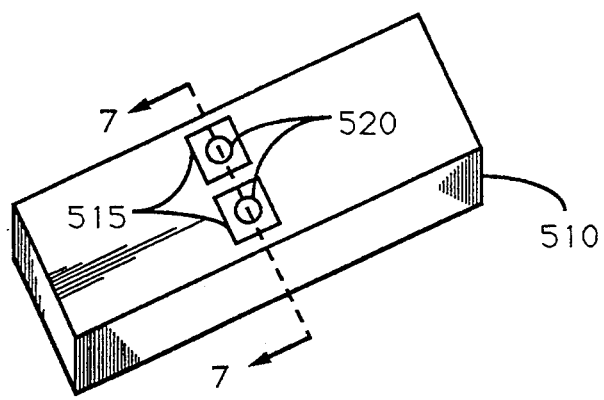
FIG. 6 is an isometric view of a package lid in accordance with a third embodiment the present invention.

FIG. 6 is an isometric view of package lid 505 in accordance with a third embodiment of the present invention. Package lid 505 comprises lid 510 having conductive pads 515 and vias 520 disposed thereon. Package lid 505 is analogous to lid 110 (FIGS. 1 through 4).

Figure 7:
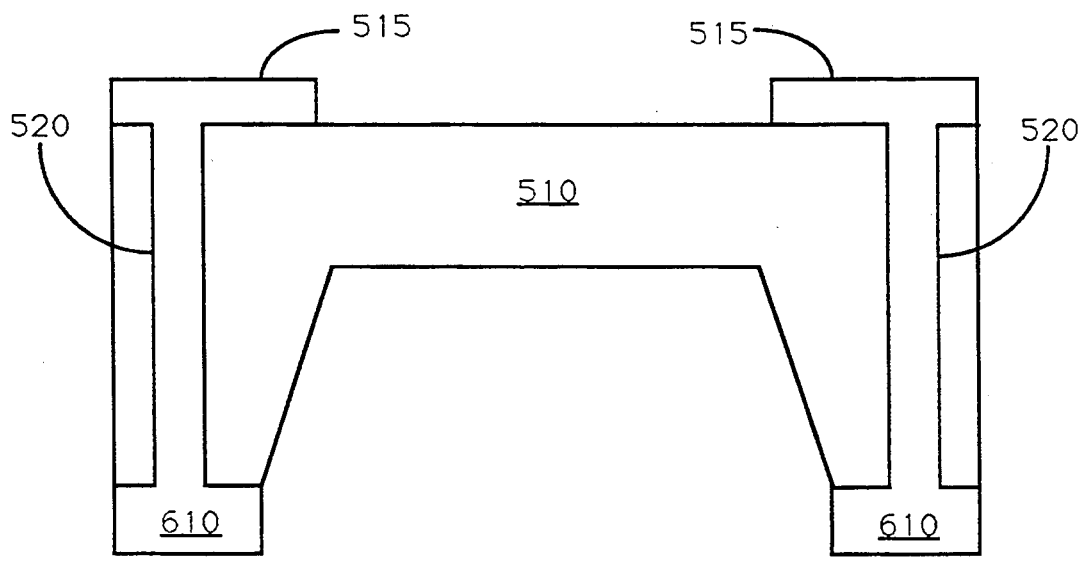
FIG. 7 is a simplified side view, in section, taken along section lines 7—7 of FIG. 6, of the package lid in accordance with the third embodiment of the present invention.

FIG. 7 is a simplified side view, in section, taken along section lines 7—7 of FIG. 6, of portion 605 of package lid 505 in accordance with the third embodiment of the present invention. Portion 605 includes conductive pads 515 disposed on a top surface of package lid 505, for example, and electrically coupled to vias 520 and thereby to conductor 610 disposed on a bottom surface of lid 510. Conductor 610 is analogous in function to conductor 210 of FIGS. 1 through 5.

When lid 505 is employed together with a package base similar to insulating spacer 115 of FIGS. 1, 2 and 5, a simplified package structure suitable for certain applications results because plinth 120 and the attendant elements thereon are no longer required (insulating spacer 115 must have provisions for interconnections such as interconnections 125 of FIGS. 1 and 3 thereon or may employ wrap-around interconnections) because conductive loop 210 is no longer part of the package basal assembly.

Figure 8:
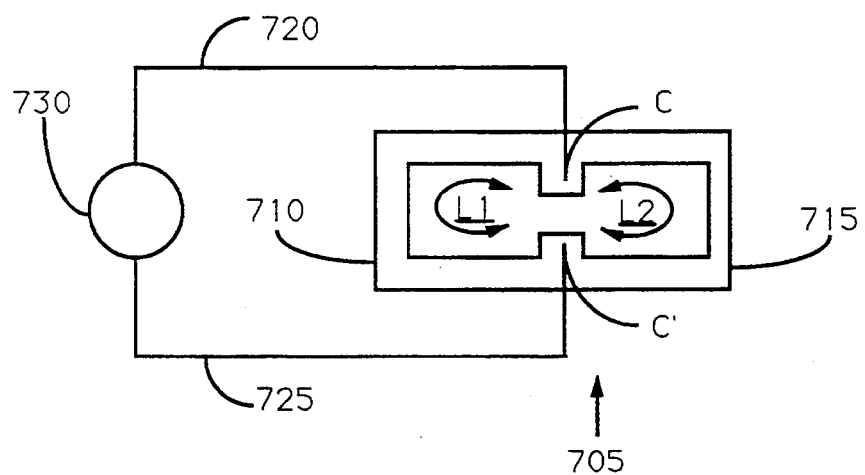
FIG. 8 is a schematic diagram of a conductive loop and an electrical power supply in accordance with a first preferred embodiment of the present invention.

FIG. 8 is a schematic diagram of conductive loop 705 and electrical power supply 730 in accordance with a first preferred embodiment of the present invention. Conductive loop 705 includes contact pair C and C', analogous to pads 130 (FIGS. 1 through 4), pads 420 (FIG. 5) and/or pads 515 (FIGS. 6 and 7).

Contact C is coupled to one terminal of electrical power supply 730 via lead 720 while contact C' is coupled to another terminal of electrical power supply 730 via lead 725. Conductive loop 705 is analogous to conductor 210 (FIGS. 1 through 5) and to conductor 610 (FIG. 7).

Conductive loop 705 is shown as comprising portion 710 having length L1 and portion 715 having length L2, where L1 is approximately equal to L2. Portion 710 also has an associated electrical resistance R1 while portion 715 has an associated electrical resistance R2. Resistances R1 and R2 are designed to be approximately equal and so portions 710 and 715 experience similar temperature rises in response to electrical stimulation from electrical power supply 730 via leads 720 and 725.

Portions 710 and 715 of conductive loop 705 are thermally coupled by insulating spacer 115 (FIGS. 1, 2 and 5) (if present) to sealant 215 (FIGS. 1 through 5) and so sealant 215 melts uniformly around the edges of insulating spacer 115 and/or plinth 120 in response to electrical stimulation by power supply 730 of conductive loop 705. After sealant 215 has melted and wetted a lower portion of lid 110 (FIGS. 1 through 4) or 510 (FIGS. 6 and 7) and/or an upper portion of plinth 120 (FIGS. 3 and 4) and/or insulating spacer 115 (FIGS. 1, 2 and 5), electrical power supply 730 is turned down or off or is decoupled from conductive loop 705, allowing sealant 215 to cool and solidify to provide a hermetic seal.

Localized heating and melting of sealant 215 is thus effected without heating microfabricated device 225 (FIGS. 2 and 4) on device mounting pad 470 (FIG. 5) to the temperatures required to melt sealant 215. This is extremely important for microfabricated devices 225 (FIGS. 2 and 4) unable to withstand temperature extremes (e.g., devices fashioned from temperature-sensitive materials such as $LiNbO_3$, $LiTaO_3$, quartz in the form of single crystal $SiO_2$, ACT and HACT devices) and/or devices mounted by temperature sensitive die attach materials 220 (e.g., low melting temperature thermoplastics). The ability to selectively heat sealant 215 and not microfabricated device 225 and/or die attachment material 220 to melting temperatures of sealant 215 comprises a key feature of the present invention.

Examples of thermoplastic materials suitable for use as die attachment materials (i.e., 220 of FIGS. 2 and 4) and/or as sealant materials (e.g., sealant 215 of FIGS. 1 through 5) are listed below, together with their respective melting points, in Table I.

TABLE I

| BONDING TEMPERATURES FOR SEVERAL THERMOPLASTIC MATERIALS | |
| --- | --- |
| MATERIAL | BONDING TEMPERATURE (°C.) |
| Polyetheretherketone | 360 |
| Polysulfone | 300–380 |
| Polyethersulfone | 320–380 |
| Polyetherimide | 340–380 |
| Polybutlyeneterepthalate | 240 |
| Polycarbonate | 230–290 |

Such materials are available from a variety of vendors including Alphametals of Jersey City, N.J., E. I. DuPont Nemours of Towards, Pa. and AI Technology of Princeton, N.J.

One example of a low-melting-temperature glass suitable for use as die attachment material 220 and/or sealant material 215 is a mixture of PbO and $V_2O_5$ available from VLSI of Los Angeles, Calif. as a coating on the lower surface of a lid, etc., and which can be melted at temperatures of about 360° C. Another example of a glassy material suitable for die attachment and/or package sealing is a titania free base glass to which has been added 23.6 to 36.4 weight percent lead titanate powder to give a glass plus ceramic mixture consisting essentially of (by weight percent) 2.5–10.7% $GeO_2$, 0–2.3% $SiO_2$, 58.6–78.5% PbO, 0–5.3% $PbF_2$, 7–13% $B_2O_3$, 2.5–6.9% $Al_2O_3$, 0–5.3% ZnO, 0.4–2.3% $V_2O_5$, 0–5.3% CdO and 6.2–9.6% $TiO_2$, for example, as described in U.S. Pat. No. 4,592,794, entitled "Glass Bonding Method" by E. Davis et al. and which is incorporated herein by reference.

Figure 9:
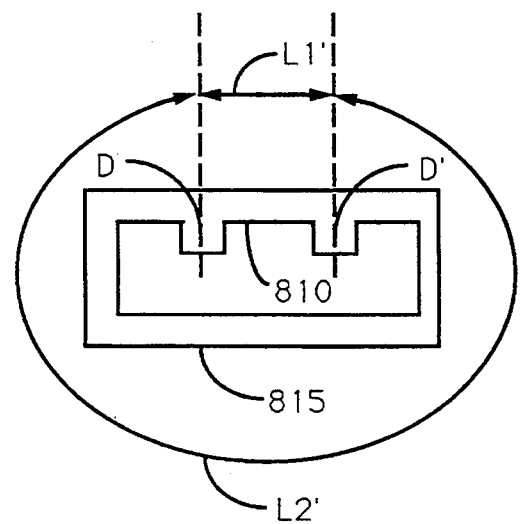
FIG. 9 is a sketch of a conductive loop in accordance with a second preferred embodiment of the present invention.

FIG. 9 is a sketch of conductive loop 805 in accordance with a second preferred embodiment of the present invention. Conductive loop 805 is shown as including contact pair D and D', analogous to pads 130 (FIGS. 1 through 4), 420 (FIG. 5) or 515 (FIGS. 6 and 7).

Contact D is coupled to one terminal of an electrical power supply (not shown) while contact D' is coupled to another terminal of the electrical power supply. Conductive loop 805 is analogous to conductor 210 (FIGS. 1 through 5) and to conductor 610 (FIG. 7).

Conductive loop 805 comprises portion 810 having length L1' and portion 815 having length L2'. Portion 810 also has associated electrical resistance R1 while portion 815 has associated electrical resistance R2. Resistances R1 and R2 are designed to provide power dissipations per unit length which are approximately equal when electrically stimulated and so portions 810 and 815 experience similar temperature rises in response to electrical stimulation from an electrical power supply (not shown).

Resistances R1 and R2 are coupled in parallel and so lengths L1' and L2' have the same voltage V applied thereto. The power per unit length dissipated in length L1' is thus equal to $V^2/R1$ divided by length L1'. Similarly, the power per unit length dissipated in length L2' is equal to $V^2/R2$ divided by length L2'. Equating the power per unit length for resistances R1 and R2 provides $V^2/R1L1' = V^2/R2L2'$ or $R1L1' = R2L2'$ (i.e., the resistance-length products of each of portions 810 and 815 of conductive loop 805 are equal).

Portions 810 and 815 are thermally coupled to sealant 215 (FIGS. 1 through 5) by insulating spacer 115 (FIGS. 1, 2 and 5) (if present) and so sealant 215 melts uniformly around the edges of insulating spacer 115 and/or plinth 120 in response to electrical stimulation provided by an electrical power supply.

After sealant 215 has melted and wetted a lower portion of lid 110 (FIGS. 1 through 4) or 510 (FIGS. 6 and 7) and/or an upper portion of plinth 120 (FIGS. 1 through 5) and/or insulating spacer 115 (FIGS. 1, 2 and 5), the electrical power supply is turned down or off or is decoupled from conductive loop 805, allowing sealant 215 to cool and solidify to provide a hermetic seal.

Sealant 215 may comprise conductor 210 (FIGS. 1 through 5), conductor 610 (FIG. 7) and/or conductive loops 705 (FIG. 8), 805 (FIG. 9) if these elements comprise a solder such as AuGe, AuSi, SnPb and the like, deposited together with suitable wetting/adhesion layers and heated to melting by electrical stimulation applied directly thereto.

While the example of FIG. 9 illustrates loop 805 comprising two elements 810 and 815 of unequal lengths L1' and L2' and two contacts D and D' the principle of maintaining a constant resistance per unit length for p many elements coupled in parallel to a common electrical power supply can easily be extended to more complex packaging scenarios having plural hermetically sealed cavities provided that the resistance-length products of each section are equal to some common value K or:

$$R_p L_p = K, \qquad (1)$$

where $R_p$ represents the resistance of the $p^{th}$ element, $L_p$ represents the length of the $p^{th}$ element and K is a constant having dimensions of Ω-cm., for example.

A key feature of the present invention can be appreciated by noting that an open loop (viz, loop 805 with the portion between D, D′ having length L1′ missing) would not require the current sharing properties discussed hereinabove and summarized in Eq. 1 but also would not provide a continuous seal around the edges of the lid/package base (that portion corresponding to length L1′ would not be sealed) and so could not provide the hermetic seal of the present invention.

Figure 10:
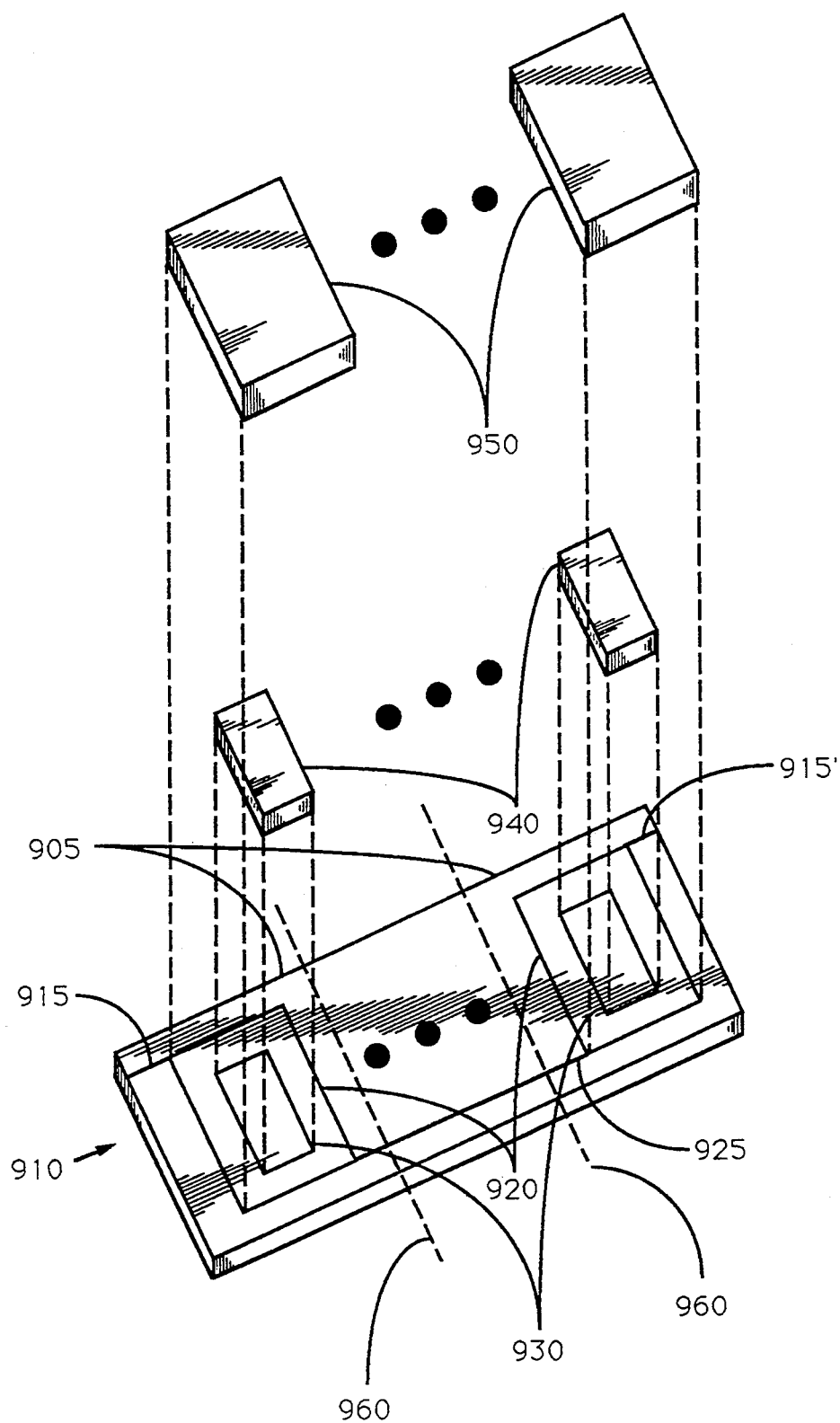
FIG. 10 is a simplified exploded view of groups of microfabricated devices and packages in accordance with the present invention.

FIG. 10 is a simplified exploded view of groups of microfabricated devices 940 and lids 950 (pairs of each element are explicitly shown, with ellipsis denoting presence of further intervening elements) and basal assembly 910 comprising package bases 905 in accordance with the present invention.

FIG. 10 illustrates sealing of basal assembly 910 comprising groups of package bases 905 to groups of lids 950 en masse to form either an assembly of multichip modules or a plurality of individually packaged devices. Package bases 905 are analogous to plinth 120 and insulating spacer 115 (FIGS. 1, 2 and 5) or to plinth 120 (FIGS. 3 and 4) and may comprise a multilayer board described infra, while lids 950 are analogous to lid 110 (FIGS. 1 through 4) or 510 (FIGS. 6 and 7). This is realized by attaching microfabricated devices 940 to die attachment pads 930 by means of die attach adhesives such as 220 of FIGS. 2 and 4 or the like, placing lids 950 on sealant material (e.g., sealant 215 of FIGS. 1 through 5) disposed over conductor pattern 920 and applying electrical energy to conductors 915, 915′, for example. Conductor pattern 920 is analogous to conductor 210 (FIGS. 1 through 5), conductive loop 705 (FIG. 8) or conductive loop 805 (FIG. 9). Electrical energy may be coupled between conductor patterns 920 by interconnections such as 925 illustrating series connection between conductor patterns 920, for example.

Other arrangements of conductors analogous to interconnections 925 such as parallel and series/parallel interconnections of conductor patterns 920 are also possible as will be appreciated by those of skill in the art.

Subsequent to sealing of lids 950 to package bases 905 of basal assembly 910 and automated electrical testing (if desired), individual packaged devices analogous to package 105 (FIG. 1) or package 301 (FIG. 3) are separated one from another by conventional means such as scribing and breaking, sawing, laser scribing and the like, which operations are carried out along scribe lines 960, for example.

While FIG. 10 illustrates a single row of package bases 905, devices 940 and lids 950 for simplicity of illustration and ease of understanding, those of skill in the art will appreciate that two-dimensional arrays are realizable.

FIG. 10 thus illustrates a technique for sealing groups of packages en masse and avoiding the labor-intensive aspects of conventional seam welding of individual packages by hand labor. Further, while discrete lids 950 are shown, an assembly comprising a group of lids analogous to basal assembly 910 may be employed to facilitate the assembly process. Conductors may be disposed on such a group of lids in lieu of conductor patterns 920 and interconnections 925, 915 and 915′ in a fashion analogous to that of FIGS. 6 and 7.

Figure 11:
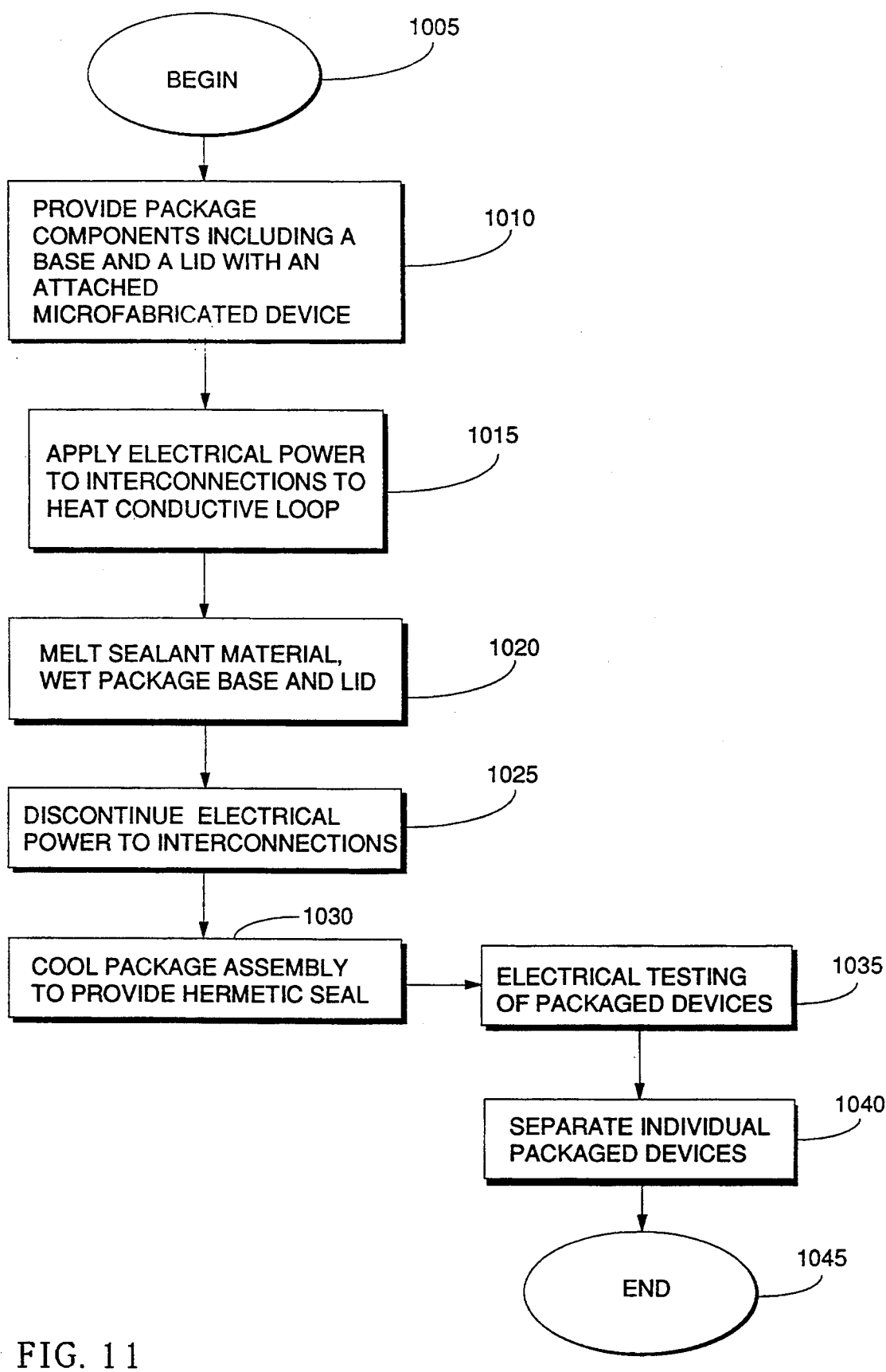
FIG. 11 is a flow chart of steps in packaging microfabricated devices in accordance with the present invention.

FIG. 11 is a flow chart of steps in packaging microfabricated devices in accordance with the present invention. The method initiates (block 1005) by providing (block 1010) package components including a package base or plinth and a lid, where the package base includes an attached microfabricated component or device.

Either the package base/plinth or the lid or both includes a conductive loop having electrical interconnections attached thereto, and the package base/plinth and/or lid includes sealant material disposed thereon as described hereinabove with reference to FIGS. 1 through 10.

Electrical power is coupled (block 1015) to the conductive loop to melt (block 1020) the sealant material and to wet the package base/plinth and the lid with the molten sealant. Electrical power is then decoupled (block 1025) from the conductive loop and the package is cooled (block 1030) to provide a hermetic seal and a hermetically sealed environment surrounding the microfabricated component. Optionally, electrical testing (block 1035) of the microfabricated component(s) may then be performed.

If the steps identified in blocks 1010 through 1030 (or 1035) are carried out on groups of devices which are physically joined prior to and during the sealing process (as shown, by way of example, in FIG. 10), these may be (block 1040) following the cooling step (block 1030) to provide individual packaged devices (e.g., 105 of FIG. 1 or 301 of FIG. 3) and the process is terminated (block 1045).

EXAMPLE

Figure 12:
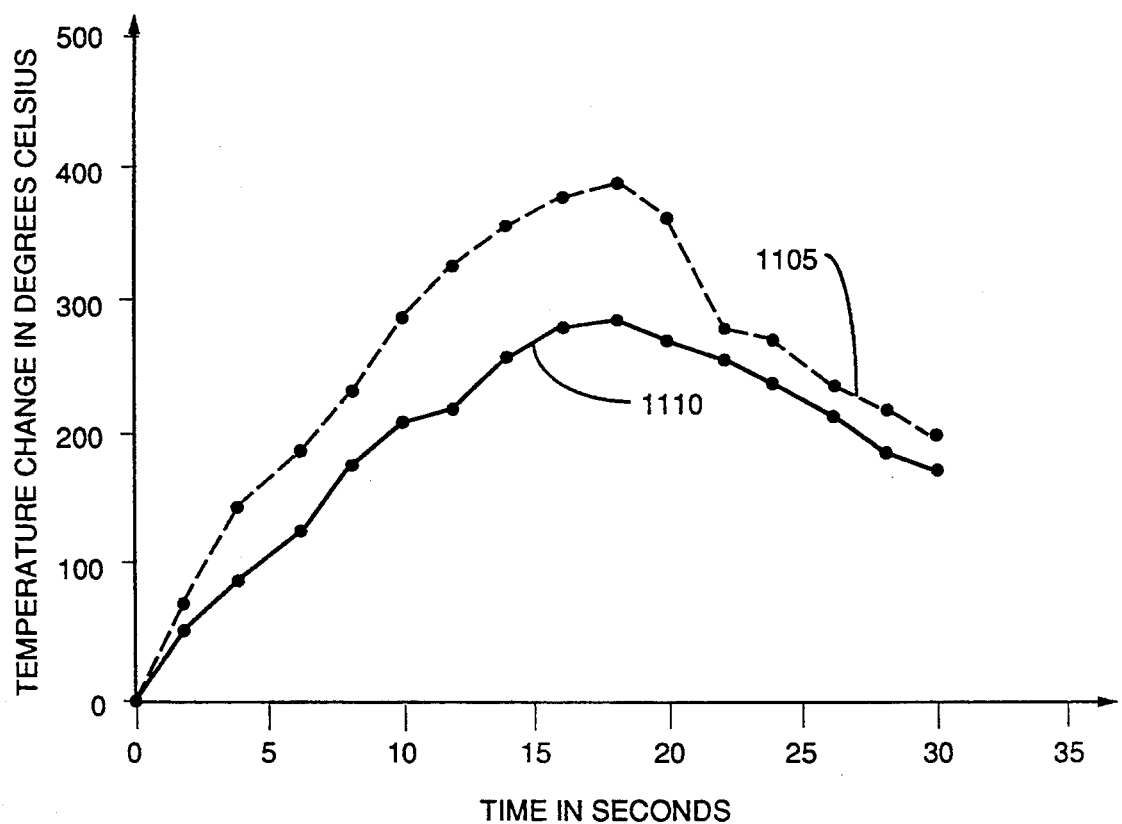
FIG. 12 is a graph of temperatures versus time at different points on a package during package sealing in accordance with the present invention.

FIG. 12 is a graph of temperature changes in degrees Celsius from ambient versus time in seconds, with the temperature measured by conventional thermocouples at different points on a package such as 105 of FIG. 1 during package sealing in accordance with the present invention.

Electrical power (16 Watts) was applied for 16 seconds by supplying 400 milliamperes to a conductive loop having a terminal resistance (i.e., as measured at terminals C, C′ of FIG. 7, for example) of 100 Ω, delivered at a voltage of 40 Volts and corresponding to a total energy of 256 Watt-seconds.

Curve 1105 corresponds to temperature measured directly above a conductive loop (e.g., at the location of sealant 215 of FIGS. 1 through 5) while curve 1110 corresponds to temperatures measured in a central portion (e.g., device mounting pad 470 of FIG. 5) thereof.

A temperature difference of about 100° C. is apparent from comparison of peak values of curves 1105 and 1110, showing that a microfabricated device mounted within such a package need not be heated to the melting temperature of the sealing material as is required with oven curing, for example.

Also apparent from inspection of FIG. 12 is that the entire sealing process is quite rapid, occurring during an interval of less than one minute. The energy for melting the seal is delivered directly to the seal and so a much smaller volume and hence thermal mass is heated and this provides energy savings when compared to oven curing, for example.

Figure 13:
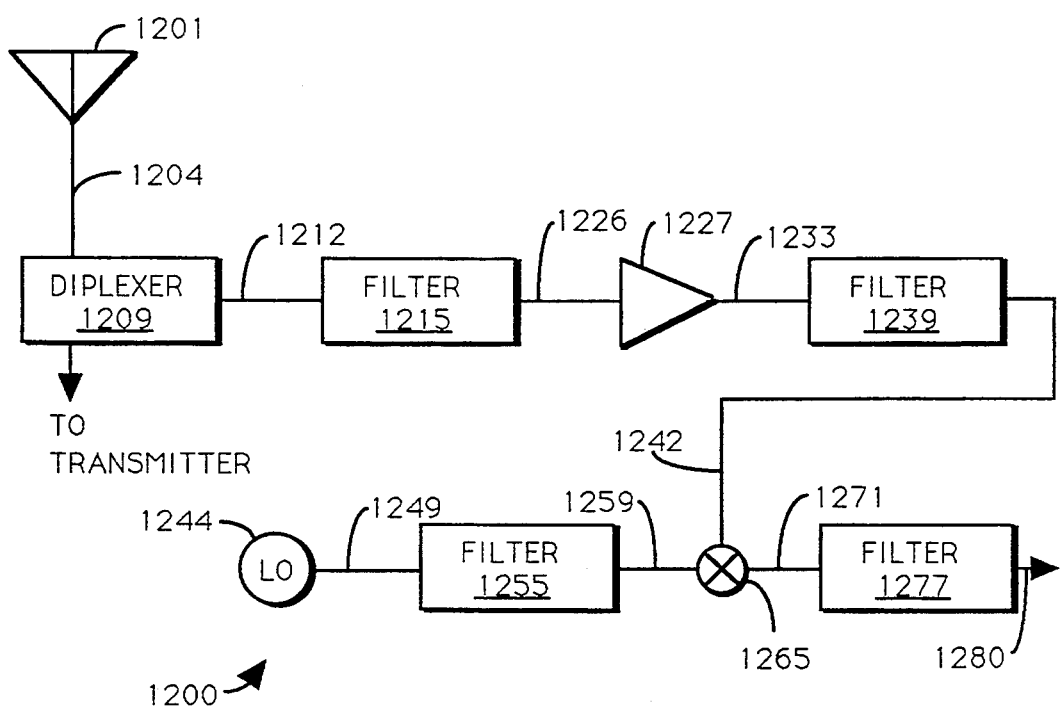
FIG. 13 is a block diagram of a portion of a communications apparatus including microfabricated devices in accordance with the present invention.

FIG. 13 is a block diagram of portion 1200 of a communications apparatus including one or more microfabricated devices, represented in this example by acoustic wave filters, packaged in accordance with the present invention. Apparatus 1200 includes antenna 1201 and antenna lead 1204, by way of example, employed to receive and/or transmit signals.

Alternatively, antenna 1201 and antenna lead 1204 may be replaced by a fiber-optic link or a cable or other signal transmissive media. Diplexer 1209 is coupled to antenna 1201 via antenna lead 1204 and to a transmitter portion (not shown). Diplexer 1209 couples received signals to filter 1215 via lead 1212. Filter 1215 is coupled to amplifier 1227 via lead 1226.

The output of amplifier 1227 is coupled to filter 1239 via lead 1233. Filter 1239 has an output coupled to a first input of mixer 1265 via lead 1242. The output signal from filter 1239 is combined with a local oscillator signal in mixer 1265.

The local oscillator signal originates in local oscillator 1244 and is coupled to filter 1255 via lead 1249. The output signal from filter 1255 is coupled via lead 1259 to a second input of mixer 1265. The output signal from mixer 1265 is coupled via lead 1271 to filter 1277 to provide an intermediate frequency or IF output signal via lead 1280.

Diplexer 1209, filter 1215, filter 1239, filter 1255 and/or filter 1277 may comprise acoustic wave filters packaged in accordance with the present invention.

In an alternative embodiment, the present invention may be employed to provide a resealable package for multichip modules. Multichip modules comprise a plurality of integrated circuit die analogous to microfabricated component 225 (FIGS. 2, 4) mounted within a common package such as package 105 (FIG. 1) or package 301 (FIG. 3) by solder bumps, for example.

A plurality of such modules are often combined on a single multilayer printed circuit board analogous to substrate assembly 910 (FIG. 10). A failure of one multichip module 905, 940, 950 may compromise such board 910 while a failure of one integrated circuit 940 within multichip module 105 (FIG. 1) or 301 (FIG. 3) may compromise module 105 (FIG. 1) or 301 (FIG. 3) and hence board 910. For these reasons, it is extremely desirable to be able to repair board assembly 910 by removal/replacement of a specific multichip module (e.g., 105, FIG. 1; 301, FIG. 3) and/or to repair a given multichip module 105 (FIG. 1) or 301 (FIG. 3).

Such repair requires heating individual multichip module 105 (FIG. 1) or 301 (FIG. 3) in order to remove it from board 910 and/or being able to remove a lid (e.g., lid 110, FIGS. 1, 3; lid 510, FIGS. 6, 7; lids 950, FIG. 10) from a multichip module such as 910 (FIG. 10) in order to be able to repair/replace a specific microfabricated component (e.g., 225, FIGS. 2, 4; 940, FIG. 10) contained therein.

A resealable package 105 (FIG. 1), 301 (FIG. 3), 910 (FIG. 10) which can be sealed during assembly, unsealed at a later time for repair/replacement of specified microfabricated components 225 (FIGS. 2, 4: 940, FIG. 10) and subsequently resealed to provide a repaired or upgraded module 105 (FIG. 1), 301 (FIG. 3), 910 (FIG. 10) has great utility and application to modern electronic equipments. Such modules do not necessarily require that seal 215 (FIGS. 1 through 4) be hermetic.

An additional benefit of the present invention is realized by embedding conductive/resistive loops such as 705 (FIG. 8) or 805 (FIG. 9) within a board upon which a plurality of multichip modules are mounted. This provides for removal of individual multichip modules from the board without excessive heating of other such modules contained thereupon. Similarly, conductive/resistive loops such as 705 (FIG. 8) or 805 (FIG. 9) may be embedded beneath microfabricated components such as 225 (FIGS. 2, 4) and/or 940 (FIG. 10) (e.g., beneath die attach pad 470, FIG. 5) to allow selective replacement/placement/removal of specific die from a multichip module without excessive heating of other elements contained therein.

Sealant material 215 (FIGS. 1 through 5) may comprise a material such as B-stage epoxy, for example, which does not melt but rather sets in response to applied heat. Other types of materials wherein setting occurs in response to thermal stimulation may be employed for seal 215.

Vendors providing custom-tooled packages for multichip modules include Hughes of Newport Beach, Calif., which supplies MLA (multi-layer alumina) assemblies, and also HDI (high density interconnect) boards comprising multilayer polyimide dielectric circuit board assemblies and Advanced Packaging Systems of San Jose, Calif., which supplies multilayer polyimide assemblies on substrates of aluminum nitride, silicon and/or alumina.

Thus, a method and an apparatus for hermetically packaging microfabricated devices have been described which overcome specific problems and accomplish certain advantages relative to prior art methods and mechanisms. The improvements over known technology are significant. The expense, complexities and high labor content of prior art sealing techniques are avoided, while advantages of hermeticity, plural input and/or output interconnections and appropriate thermal cycling of the microfabricated devices enclosed within the package are retained.

The foregoing description of the specific embodiments will so fully reveal the general nature of the invention that others can, by applying current knowledge, readily modify and/or adapt for various applications such specific embodiments without departing from the generic concept, and therefore such adaptations and modifications should and are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

We claim:

1. An apparatus for enclosing a microfabricated component, the apparatus including in combination:

package base means for providing a plinth including interconnections;

package lid means;

seal means coupled to said package base means and to said package lid means, said seal means for sealing said package base means to said package lid means, said seal means comprising metallic material;

conductive loop means disposed on said package lid means and thermally coupled to said seal means, said conductive loop means for preferentially heating said seal means; and means for conducting electrical energy to said conductive loop means to heat said conductive loop means and said seal means to melt said seal means and thereby to seal said package base means to said package lid means.

2. An apparatus as claimed in claim 1, wherein said package base means includes a package base comprising ceramic.

3. An apparatus as claimed in claim 1, wherein said package lid means includes a package lid comprising ceramic.

4. An apparatus as claimed in claim 1, wherein said conductive loop means comprises a plurality of portions p, each of said portions having a resistance $R_p$ and having a length $L_p$ wherein resistances $R_p$ and lengths $L_p$ of each section substantially obey a relationship:

$$R_pL_p=K,$$

wherein K is a constant.

5. An apparatus as claimed in claim 1, wherein said seal means and said conductive loop means together include solder material heated by passing electrical current through said solder material.

6. An apparatus as claimed in claim 1, wherein said conductive loop means comprises a thick film conductor.

7. An apparatus as claimed in claim 1, wherein said conductive loop means comprises a thin film conductor.

8. A communications apparatus including at least one microfabricated device in a package, said package comprising:
- a package base for providing a plinth including interconnections;
- a package lid coupled to said package base to provide a sealed enclosure;
- seal material coupled to said package base and to said package lid, said seal material comprising metallic material;
- a conductive loop disposed on said package base and thermally coupled to said seal material, said conductive loop for preferentially heating said seal material; and
- conductors for supplying electrical energy to said conductive loop to heat said conductive loop and said seal material to melt said seal material and thereby to seal said package base to said package lid.

9. A communications apparatus as claimed in claim 8, wherein said seal comprises a hermetic seal and said microfabricated device comprises an acoustic charge transport device.

10. A communications apparatus as claimed in claim 8, wherein said seal comprises a hermetic seal and said microfabricated device comprises a surface acoustic wave device.

11. A communications apparatus including at least one microfabricated device in a package, said package comprising:
- a package base for providing a plinth including interconnections;
- a package lid coupled to said package base to provide a sealed enclosure;
- seal material coupled to said package base and to said package lid, said seal material comprising metallic material;
- a conductive loop disposed on said package lid and thermally coupled to said seal material, said conductive loop for preferentially heating said seal material; and
- conductors for supplying electrical energy to said conductive loop to heat said conductive loop and said seal material to melt said seal material and thereby to seal said package base to said package lid.

12. A resealable apparatus for enclosing a multichip module, the resealable apparatus including in combination:
- a package base for providing a plinth including interconnection means;
- a package lid;
- a resealable seal coupled to said package base and to said package lid, said resealable seal comprising metallic material;
- a conductive loop disposed on said package lid and thermally coupled to said resealable seal, said conductive loop for preferentially heating said resealable seal; and
- means for conducting electrical energy to said conductive loop to heat said conductive loop and said resealable seal to melt said resealable seal and thereby to seal or unseal said package base to said package lid.

13. A communications apparatus as claimed in claim 8, wherein said conductive loop comprises a plurality of portions p having common end points, each of said portions having a resistance $R_p$ and having a length $L_p$ wherein resistances $R_p$ and lengths $L_p$ of each of the p sections substantially obey a relationship:

$$R_pL_p=K,$$

wherein K is a constant.

14. A communications apparatus as claimed in claim 8, wherein said conductive loop comprises thick film material.

15. A communications apparatus as claimed in claim 8, wherein said conductive loop comprises thin film material.

16. A resealable apparatus as claimed in claim 12, wherein said conductive loop comprises a plurality of portions p having common end points, each of said portions having a resistance $R_p$ and having a length $L_p$ wherein resistances $R_p$ and lengths $L_p$ of each of the p sections substantially obey a relationship:

$$R_pL_p=K,$$

wherein K is a constant.

17. A resealable apparatus as claimed in claim 12, wherein said conductive loop comprises thick film material.

18. A resealable apparatus for enclosing a multichip module, the resealable apparatus including in combination:
- a package base for providing a plinth including interconnection means;
- a package lid;
- a resealable seal coupled to said package base and to said package lid, said resealable seal comprising metallic material;
- a conductive loop disposed on said package base and thermally coupled to said resealable seal, said conductive loop for preferentially heating said resealable seal; and
- means for conducting electrical energy to said conductive loop to heat said conductive loop and said resealable seal to melt said resealable seal and thereby to seal or unseal said package base to said package lid.

* * * * *